US008157121B2

(12) United States Patent
Hau

(10) Patent No.: US 8,157,121 B2
(45) Date of Patent: Apr. 17, 2012

(54) DISPOSABLE CONTAINER OF LIQUID FOOD PRODUCTS AND A CAP OF A DISPOSABLE CONTAINER OF LIQUID FOOD PRODUCTS

(76) Inventor: Pakman Hau, GuangDong (CN)

( * ) Notice: Subject to any disclaimer, the term of this patent is extended or adjusted under 35 U.S.C. 154(b) by 269 days.

(21) Appl. No.: 11/571,912

(22) PCT Filed: May 24, 2005

(86) PCT No.: PCT/CN2005/000719
§ 371 (c)(1),
(2), (4) Date: Jan. 3, 2008

(87) PCT Pub. No.: WO2006/125340
PCT Pub. Date: Nov. 30, 2006

(65) Prior Publication Data
US 2008/0093429 A1    Apr. 24, 2008

(51) Int. Cl.
*A47G 19/22* (2006.01)
*A47G 21/18* (2006.01)
*B65D 77/28* (2006.01)
*B65D 51/00* (2006.01)

(52) U.S. Cl. ..... 220/705; 220/709; 220/719; 229/103.1; 215/227; 215/228; 215/229; 215/387; 215/388; 215/390; 239/33

(58) Field of Classification Search ........... 220/229, 220/254.2, 705, 709, 713, 719; 229/103.1; 215/227, 228, 229, 387, 388, 390; 239/33
See application file for complete search history.

(56) References Cited

U.S. PATENT DOCUMENTS

| 2,744,661 | A | * | 5/1956 | Davis ............... 222/189.06 |
| 3,874,554 | A | * | 4/1975 | Chang ............... 220/708 |
| 4,036,392 | A | * | 7/1977 | Martin ............... 220/521 |
| 4,165,814 | A |   | 8/1979 | Seel |
| D296,874 | S | * | 7/1988 | Dallas ............... D9/436 |
| 4,948,009 | A | * | 8/1990 | Sawatani ............... 220/229 |
| D359,196 | S | * | 6/1995 | Nichols ............... D7/570 |
| 5,996,836 | A | * | 12/1999 | Betras ............... 220/709 |
| 6,336,566 | B1 | * | 1/2002 | Lipson ............... 215/388 |
| 6,349,844 | B1 | * | 2/2002 | Betras ............... 220/709 |
| 2004/0245250 | A1 | * | 12/2004 | Hidalgo et al. ............... 220/229 |

FOREIGN PATENT DOCUMENTS

| CN | 2112606 U | 8/1992 |
| CN | 2138107 Y | 7/1993 |
| CN | 2406959 Y | 11/2000 |
| CN | 2455645 Y | 10/2001 |
| DE | 2647399 A1 | 5/1977 |

* cited by examiner

*Primary Examiner* — Anthony Stashick
*Assistant Examiner* — Madison L Wright
(74) *Attorney, Agent, or Firm* — Burns & Levinson LLP; Jacob N. Erlich; Marlo Schepper Grolnic

(57) ABSTRACT

The present invention relates to a disposable container of liquid food products or a cap thereof, having two independent round straw holes to be inserted by two ends of one bent drinking tube, wherein one of the straw holes is provided on a raised block which is on the top surface of the container or cap. The diameters of the straw holes tightly match the diameters of the drinking tube at its two ends, so that the drinking tube can be inserted into the container and pulled out repeatedly. The drinking tube used in the present invention is both for the purpose of drinking and closing the container.

4 Claims, 11 Drawing Sheets

DISPOSABLE CONTAINER OF LIQUID FOOD PRODUCTS AND A CAP OF A DISPOSABLE CONTAINER OF LIQUID FOOD PRODUCTS

CROSS-REFERENCE TO RELATED APPLICATIONS

This application is a U.S. national stage application under 35 U.S.C. 371 of International Application No. PCT/CN05/00719 filed May 24, 2005 and entitled "A DISPOSABLE BEVERAGE CONTAINER AND THE CONTAINER CAP THEREOF", which is incorporated by reference herein in its entirety for all purposes.

FIELD OF THE INVENTION

The present invention relates to the field of a disposable container of liquid food products and a cap of a disposable container of liquid food products, in particular a disposable container of liquid food products and a cap thereof wherein two straw holes are provided.

BACKGROUND

Currently in order to drink liquid food products from a disposable container of liquid food products using a drinking tube or a straw, an opening should be provided on the container or the cap thereof, whereby the drinking tube is inserted into the container for drinking the liquid in the container. The currently available container of liquid food products or the cap thereof has only one opening for inserting the drinking tube, in one of the following forms:

(A) An opening is provided on a disposable container of liquid food product or a cap thereof for inserting the drinking tube, said opening has a straw hole of which the size is bigger than that the diameter of the drinking tube. For example, the cap of the container usually has one cross-shaped cut (the cut means a break line cut off and then closed), the length of each cut is about 2-3 times of the diameter of the drinking tube. The cross-shaped cut forms four corners that are flexible, so that leakage of the drinking material can be prevented to certain extent when the cap is tightly covered on the cup of liquid food products. The consumer needs to insert the drinking tube through the center of the cross-shaped cuts in order to drink the liquid in the container. The drinking tube pushes the four corners of the cross-shaped cuts to form an opening mouth, providing a relatively large space between the drinking tube and the cross-shaped opening. Due to this space, the atmospheric pressure is applied to the drinking surfaces of the liquid food product inside the container. The consumer, when drinking through the drinking tube, produces a negative pressure in consumer's mouth, thereby the liquid in the container is sucked into the consumer's mouth as the result of the atmospheric pressure applied on the liquid in the container. This is the basic principle of drinking liquid from a container of liquid food products.

(B) For pressurized drinking liquid or liquid food product that needs to be kept its original characteristics, the sealed aluminum containers should be used. An opening area, which is a curve-shaped groove where the wall is thinner and has lower strength as compared to other parts of the container, is provided on the top of the aluminum container. A ring is provided within the opening area. When consumer pulls the ring, the opening area is opened by either pulling the opening area up or pressing the opening area down at the opposite side of the ring, until the opened area is big enough for inserting the drinking tube. The shape of the opening area should be designed to allow easy opening, and to prevent hurting consumer's fingers. The opening area is normally not round and is much larger than the diameter of the drinking tube, allowing easy drinking operation (as described in the previous paragraph). Sometimes the ring allows the consumer to take out the entire opening area or the entire cap, for providing easy access to the liquid material by using spoons or by drinking directly without drinking tube.

(C) Another type of container for liquid food products that needs to be kept fresh has a pre-defined round hole for inserting the drinking tube. The diameter of the straw hole is slightly bigger than that of the drinking tube. The straw hole is sealed with a material that can be penetrated by the drinking tube when consuming. The sealed container ensures the freshness of the liquid inside. This type of container is mostly used with "paper packaging/soft packaging" wherein the multi-layer composite paper and aluminum foil material is used to form a container box, which is then sealed after being filled with liquid food product. When consumer drinks the liquid by forcibly inserting the drinking tube into the pre-defined and sealed round straw hole, the container can be deformed by the atmospheric pressure or by hand squeezing, in order to allow the consumer to drink the liquid food products inside easily.

These current methods wherein the drinking tube is inserted into one opening straw hole have following disadvantages and problems:

(1) When halting temporarily drinking the above-mentioned packaged liquid food products, with drinking tube already inserted into the container of liquid food products, the end of the drinking tube outside the container is easily exposed to possible contamination of dust, insects, virus, bacteria or other biological materials, especially in public places. When subsequently utilizing the drinking tube again, the contaminated materials on the end of the drinking tube outside the container will enter the consumer's mouth. The problem can be prevented only if the end of the drinking tube outside the container is continuously kept in consumer's mouth.

(2) The packaged liquid food products according to previously mentioned method (A) or (B) also has the contamination problems where dust, insects, virus and bacteria etc. can enter the container through the drinking tube or the straw hole whose size has to be larger than the diameter of the drinking tube in order to allow air to enter the container, therefore causing health problems, especially when drinking in public places.

(3) The packaged liquid food product according to method (A) or (B) further has problems of accidentally spraying the liquid out by shaking or turning sideways the container when the consumer is walking or traveling in an airplane or on a boat. The reason of spraying out is because of the fact that the size of the straw hole should be larger than the diameter of the drinking tube for allowing entrance of air, as mentioned before. The spraying out may cause contamination to environment or clothes etc.

(4) When drinking the packaged liquid food products according to method (C) by inserting the drinking tube into the sealed round straw hole through the sealing material, the consumer may have difficulties sucking out the liquid since the drinking tube is tightly surrounded by the straw hole. If, on the other hand, the consumer intentionally or accidentally opens up the straw hole to larger size, the problems of above-mentioned contamination or leakage could occur. Furthermore, if the consumer accidentally squeezes the liquid food product container that is made of flexible materials, the liquid can be easily ejected from the drinking tube, thus causing contamination to environment or clothes.

SUMMARY OF THE INVENTION

In order to overcome the above-mentioned problems, the goal of the present invention is to provide a simple disposable container of liquid food products or the cap thereof that is simply designed and can effectively prevent contamination at the end of the drinking tube outside the container so as to protect the health of consumer, and prevent spraying out of the liquid, and can provide easy access to the drinking materials in the container.

For achieving the above goal, the present invention proposes a container cap of liquid food products, characterized in that two independent round straw holes are provided on said cap to be inserted respectively by two ends of one bent drinking tube, with the inner diameters' tolerance of the said straw holes matching with the outer diameters' tolerance of said drinking tube, so that the drinking tube can be inserted and pulled repeatedly.

The disposable container cap of liquid food products is further characterized in that said straw holes are cone-shaped, with the diameter at the outer surface bigger than the diameter of said drinking tube, and the diameter at the inner surface matching the diameter of the tube.

Furthermore, a bending device for bending/forming the drinking tube is provided on the disposable container cap of liquid food products, which is formed by punching out one or two raised block(s) on the cap.

The present invention also proposes a disposable container of liquid food products, characterized in that two independent round straw holes provided on said container that are predefined and sealed for keeping the original characteristics of the liquid food product. When consuming, two round straw holes will be opened and inserted respectively by two ends of one bent drinking tube, the diameters of the said straw holes tightly match the diameters of said drinking tube at its two ends, but the drinking tube can be inserted and pulled repeatedly.

A device for bending the drinking tube is provided on the top of the disposable container of liquid food products, or on the body of the container, which is formed by punching out one or two raised block(s) on the container.

According to the present invention, the inner diameters of the round straw holes tightly match the diameters of the drinking tube at its two respective ends, regardless whether the diameters at the two ends of the drinking tube are the same or not, and the drinking tube can be inserted and pulled repeatedly. Whenever and wherever the consumer temporarily halts drinking, the drinking tube can be bent and two ends of it can be inserted respectively into two straw holes on the container of liquid food products, to form a sealed body. The present invention has the following advantages:

(1) Liquid in the container cannot be leaked or sprayed out even when the container is shaken or turned sideways, therefore contamination to the environment or clothes can be prevented.

(2) Dust, insects, virus, bacteria or other biological materials in the air cannot enter the container or the drinking tube, therefore cannot contaminate the ends of the drinking tube that will be in contact with consumer's mouth during drinking.

(3) When the consumer throws the container with some remnant liquid food product still inside it into a rubbish bin, the contamination of the liquid to the environment can be prevented or reduced as long as the two ends of the drinking tube are inserted into the two round straw holes of the container.

(4) Consumer can easily suck the liquid out of the container because one of the two straw holes will allow air to enter the container when drinking the liquid food products.

Other goals features or advantages can be better understood from the following preferred embodiments, described with reference to the accompanying drawings.

DETAILED DESCRIPTION OF THE INVENTION

The present invention and its preferred embodiments are further described in details with reference to the drawings.

The most commonly used drinking tubes include: straight cylindrical tubes of equal diameter, straight cylindrical tubes with bendable joint, straight cylindrical and extendable two-section tubes (normally used for carton based packages), and U-shaped bendable cylindrical tubes. The eases where the drinking tubes of the above types are bent by consumer and then inserted into a container of liquid food products or a cap of a container of liquid food products according to the present invention are described in the following paragraphs.

Figures 1A, 1B, 1C:
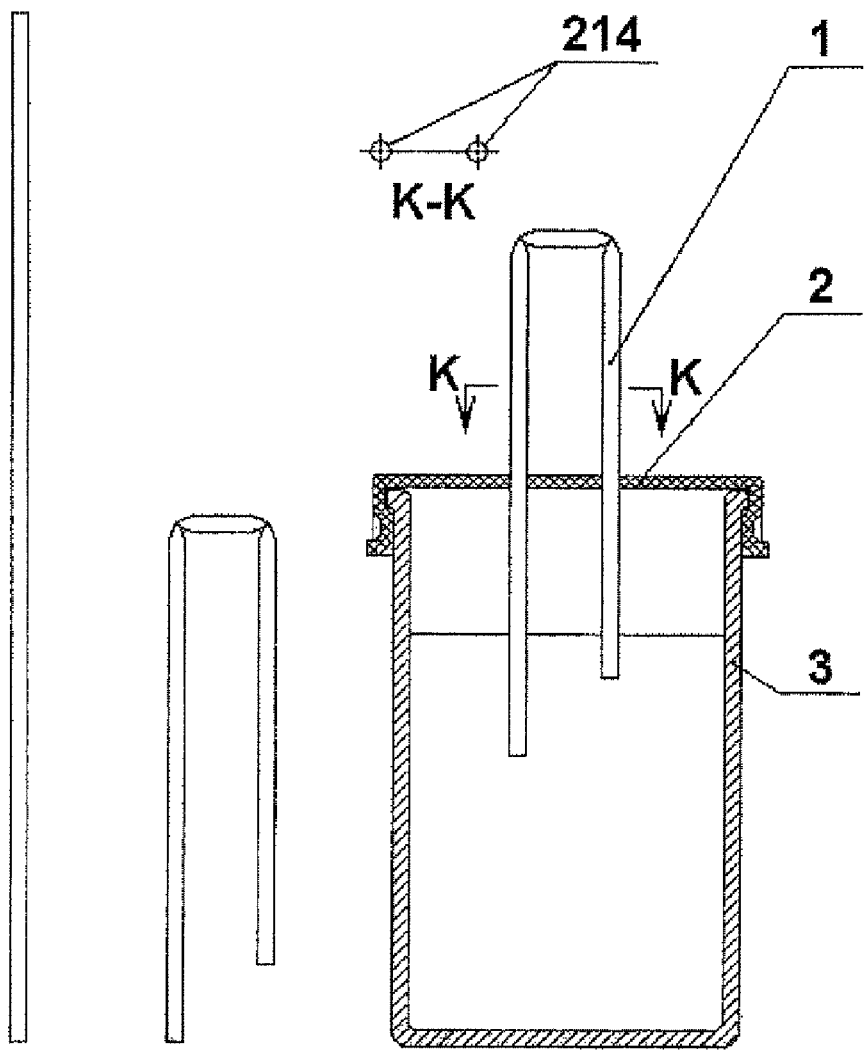
FIGS. 1A, 1B and 1C illustrate the first embodiment of the present invention where two straw holes are provided on a container of liquid food products or a cap thereof.

FIGS. 1A, 1B and 1C are cross-section views showing that a container of liquid food products or a cap thereof having two straw holes is used with the straight drinking tube of equal diameter. Said container cap (2), when manufactured separately from the container, has two independent round straw holes (214). Two ends of a bent drinking tube (1) are inserted into said straw holes (214) with the diameter of the drinking tube (1) tightly matching the two straw holes (214), so that the drinking tube (1) can be inserted and pulled repeatedly. Alternatively when the container of liquid food products is a single body without a separate cap, the top (2) of the container has two independent round straw holes (214). Two ends of a bent drinking tube (1) are inserted into said straw holes (214) with the diameter of the drinking tube (1) tightly matching the two straw holes (214), so that the drinking tube (1) can be inserted and pulled repeatedly. When using the straight drinking tube with equal diameter (as shown in FIG. 1A), the two straw holes (214) have the same diameter that is tightly matching the diameter of the drinking tube. The consumer can bend the drinking tube at two positions to form a U-shaped drinking tube (as shown in FIG. 1B). Then the two ends of the U-shaped drinking tube (1) are inserted into the two respective straw holes (214) of the container of liquid food products (3) (as shown in FIG. 1C). The drinking tube (1) at the two ends should be parallel with each other, and should be perpendicular to the top surface of the container (3) or container cap (2) at the position of the two straw holes (214), as much as possible.

Figures 2A, 2B, 2C:
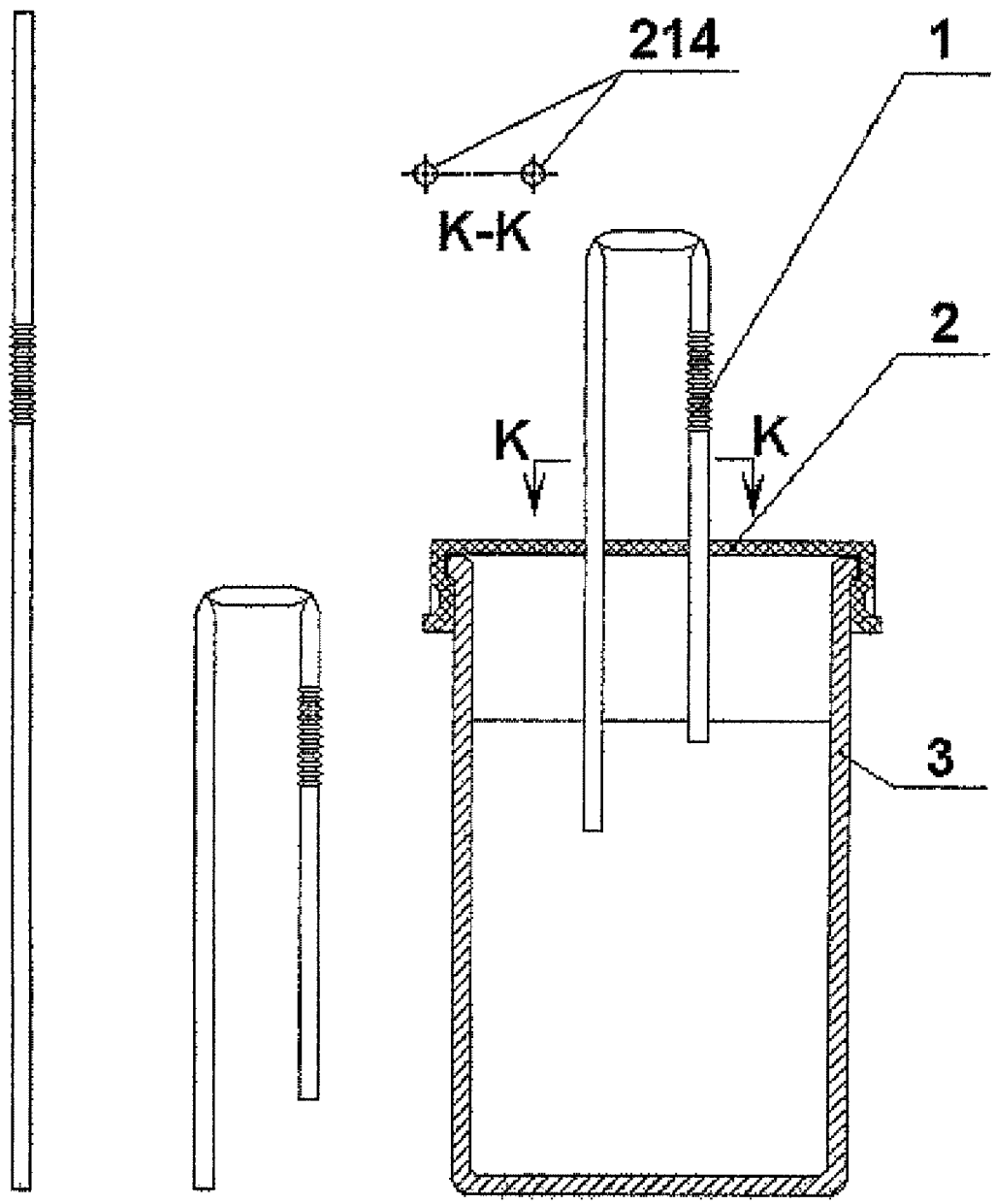
FIGS. 2A, 2B and 2C illustrate the second embodiment of the present invention where two straw holes are provided on a container of liquid food products or a cap thereof.

FIGS. 2A, 2B and 2C are cross-section views showing that a container of liquid food products or a cap thereof having two straw holes is used with a drinking tube with bendable joint. When used with a drinking tube with a bendable joint (as shown in FIG. 2A), the two straw holes (214) have the same diameter that is tightly matching the diameter of the drinking tube, according to the present invention. If this type of drinking tube cannot be bent 180° to form the U-shape as required by the present invention, the drinking tube is actually used in the same way as the above-mentioned straight drinking tube with equal diameter, that is the consumer can bend the drinking tube at two positions to form a U-shaped drinking tube (as shown in FIG. 2B). Then the two ends of the U-shaped drinking tube (1) are inserted into the two respective straw holes (214) of a container of liquid food products (3) or a container cap/cover, as shown in FIG. 2C.

Figures 3A, 3B, 3C:
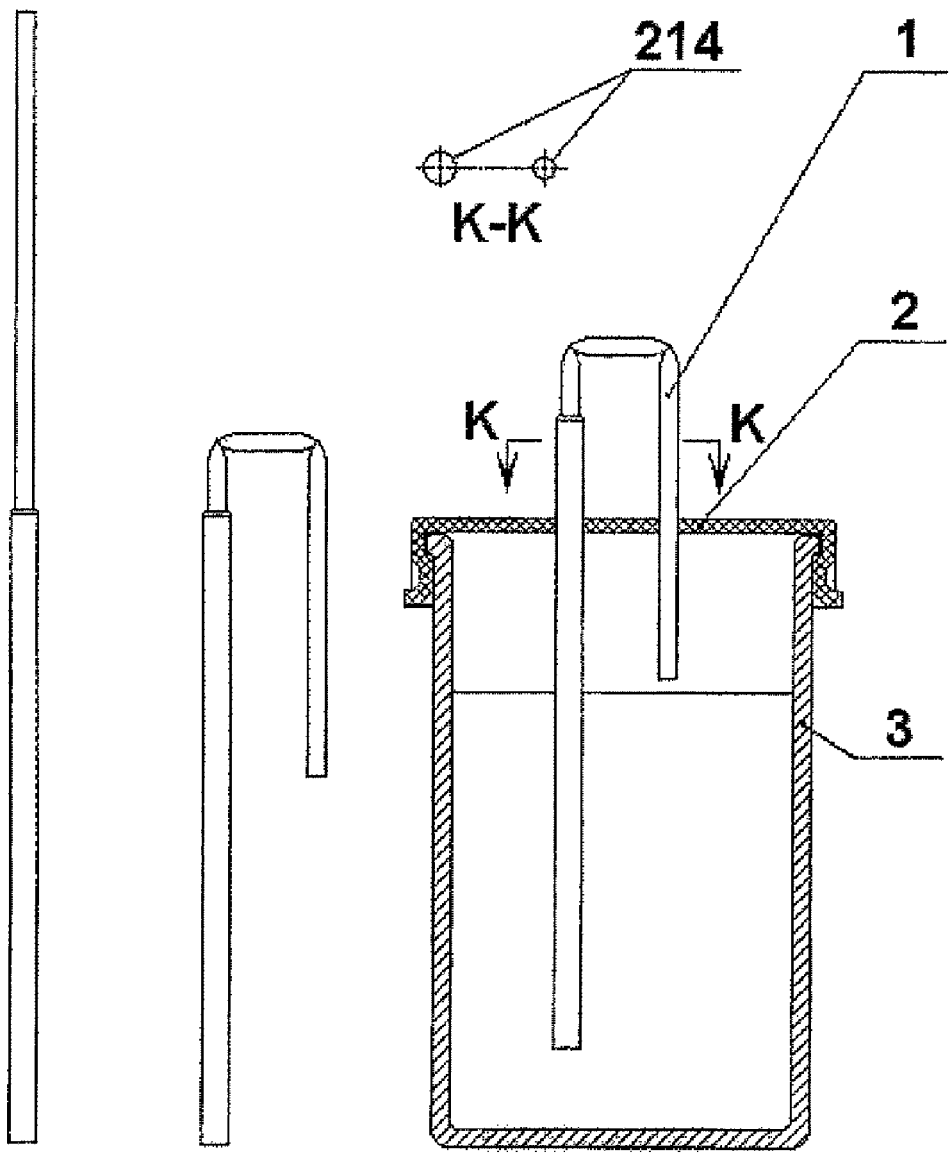
FIGS. 3A, 3B and 3C illustrate the third embodiment of the present invention where two straw holes are provided on a container of liquid food products or a cap thereof.

FIGS. 3A, 3B and 3C are cross-section views showing that a container of liquid food products or a cap thereof having two straw holes is used with the extendable two-section drinking tube. When using the liquid food product container with the extendable two-section drinking tube (as shown in FIG. 3A), the consumer can pull out one part of the drinking tube and bend it twice to form the required U-shape (as shown in FIG. 3B) by himself Then the two ends of the U-shaped drinking tube (1) are inserted into the two respective straw holes (214) of a container of liquid food products (3) or a container cap (as shown in FIG. 3C). In this case the two straw holes have different diameters that are matching the diameter of the drinking tube at its two ends respectively.

Figures 4A, 4B:
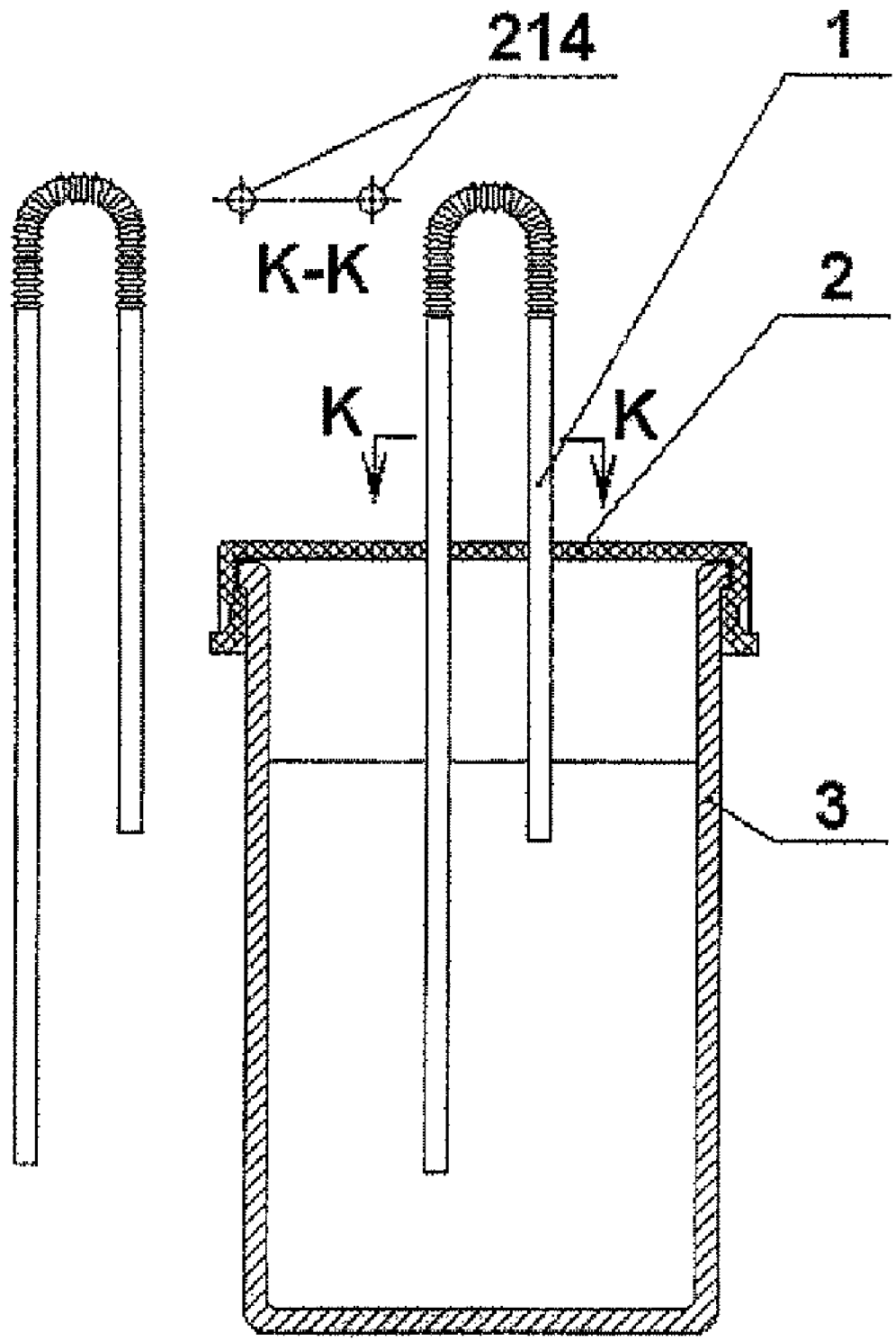
FIGS. 4A and 4B illustrate the fourth embodiment of the present invention where two straw holes are provided on a container of liquid food products or a cap thereof.

FIGS. 4A and 4B are cross-section views showing that a container of liquid food products or a cap thereof having two straw holes is used with the U-shaped drinking tube with bendable joint. When using the container with the U-shaped drinking tube with bendable joint (as shown in FIG. 4A), the consumer can directly insert the two ends of the U-shaped drinking tube into the two straw holes (214) of a container of liquid food products (3) (as shown in FIG. 4B) or a container cap. In this case the diameters of the two straw holes (214) are same, and tightly match that of the drinking tube.

The above-mentioned two straw holes (214) can either be on the same flat surface (as shown in FIGS. 1C, 2C, 3C and 4B), or on different flat or curved surfaces, regardless what type of the drinking tube is used, and in what way of the drinking tube will be bent by consumer.

Figure 5A:
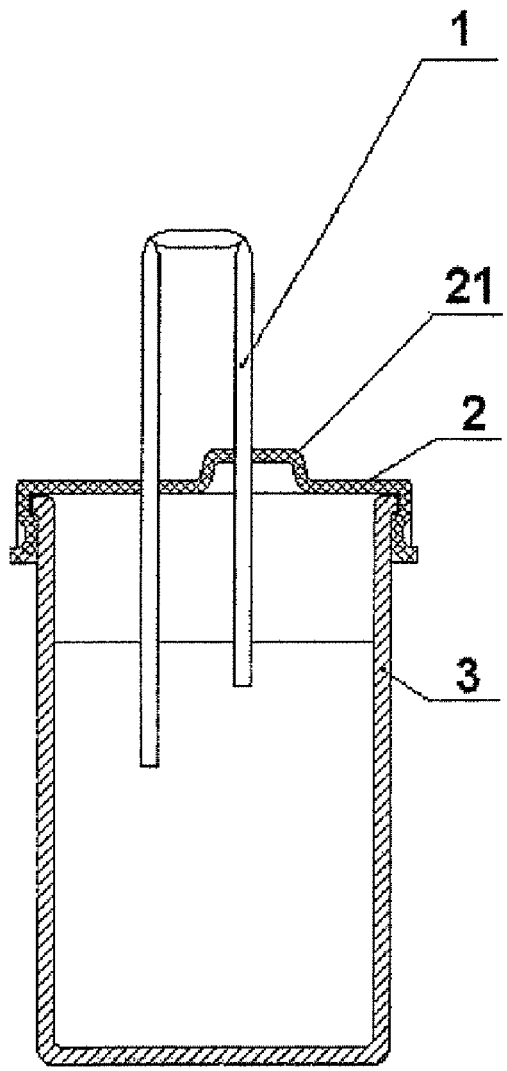
FIG. 5A is cross-section view showing that two straw holes are on the two parallel flat surfaces on a container of liquid food products or a cap thereof
Figure 5B:
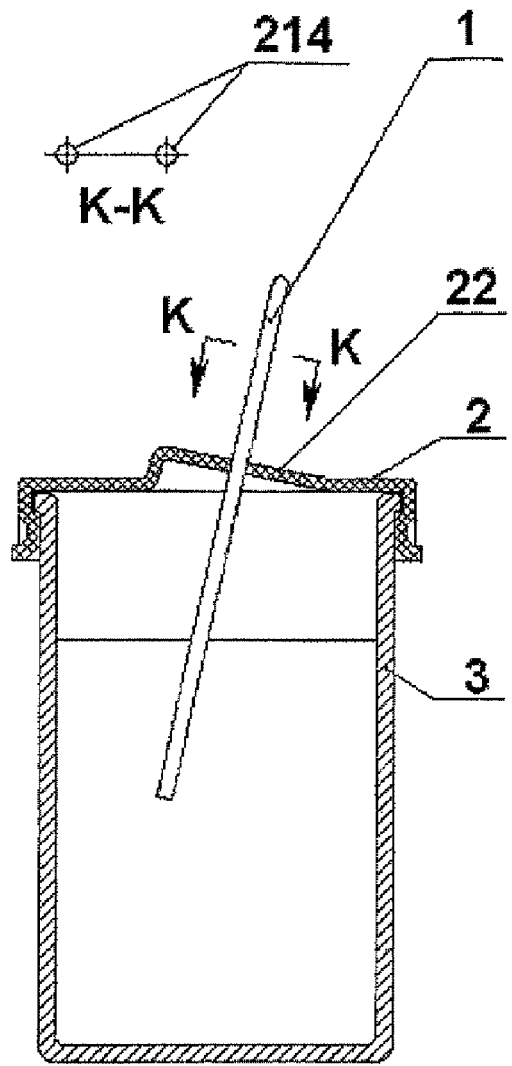
FIG. 5B is cross-section view showing that two straw holes are opened on the surface that has an angle to the flat surface of a container of liquid food products or a cap thereof.

As shown in FIG. 5A, the two straw holes (214) provided on the top of a container of liquid food products or a cap thereof according to the present invention are on the different flat surfaces that are parallel to each other. One of them is provided on the raised block (21) of the top surface of a container or a container cap (2). According to the embodiment as shown in FIG. 5B, two straw holes (214) according to the present invention are provided on a flat surface (22) that has an angle to the top surface of the container cap (2), and the bent drinking tube (1) is inserted through the straw holes on the tilted surface (22).

Figures 6A, 6B:
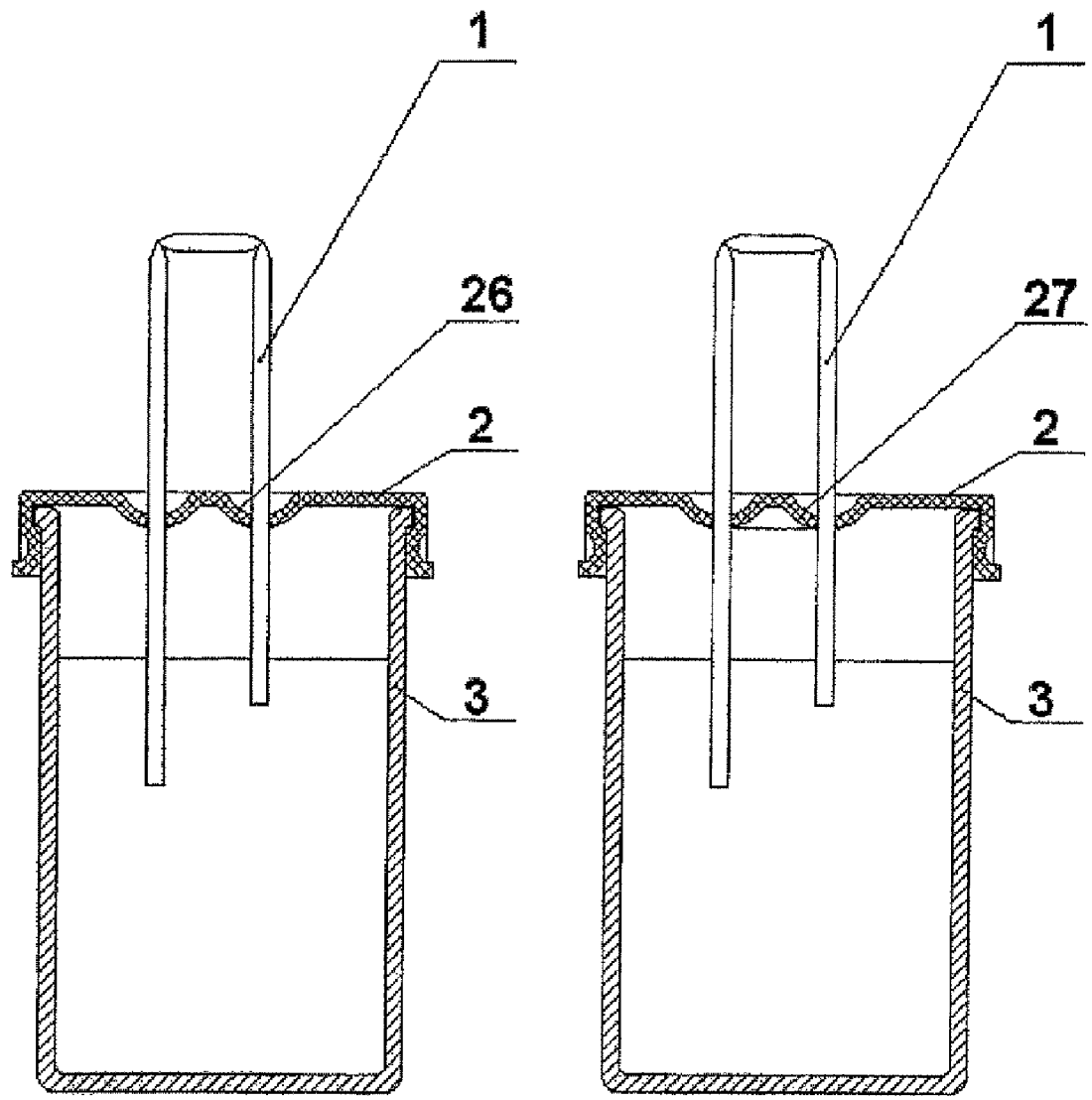
FIG. 6A is cross-section view showing that two straw holes are opened on two spherical surfaces on a container of liquid food products or a cap thereof respectively.
FIG. 6B is cross-section view showing that two straw holes are opened on the circular groove on a container of liquid food products or a cap thereof.

The two straw holes (214) according to the present invention can also be opened on the same or different curved surfaces on the top of a container of liquid food products or a cap thereof. As shown in FIG. 6A, the two round straw holes according to the present invention are opened on two separate spherical surfaces (26) The two round straw holes can also be on the same circular groove surface (27) as shown in FIG. 6B.

Figure 7:
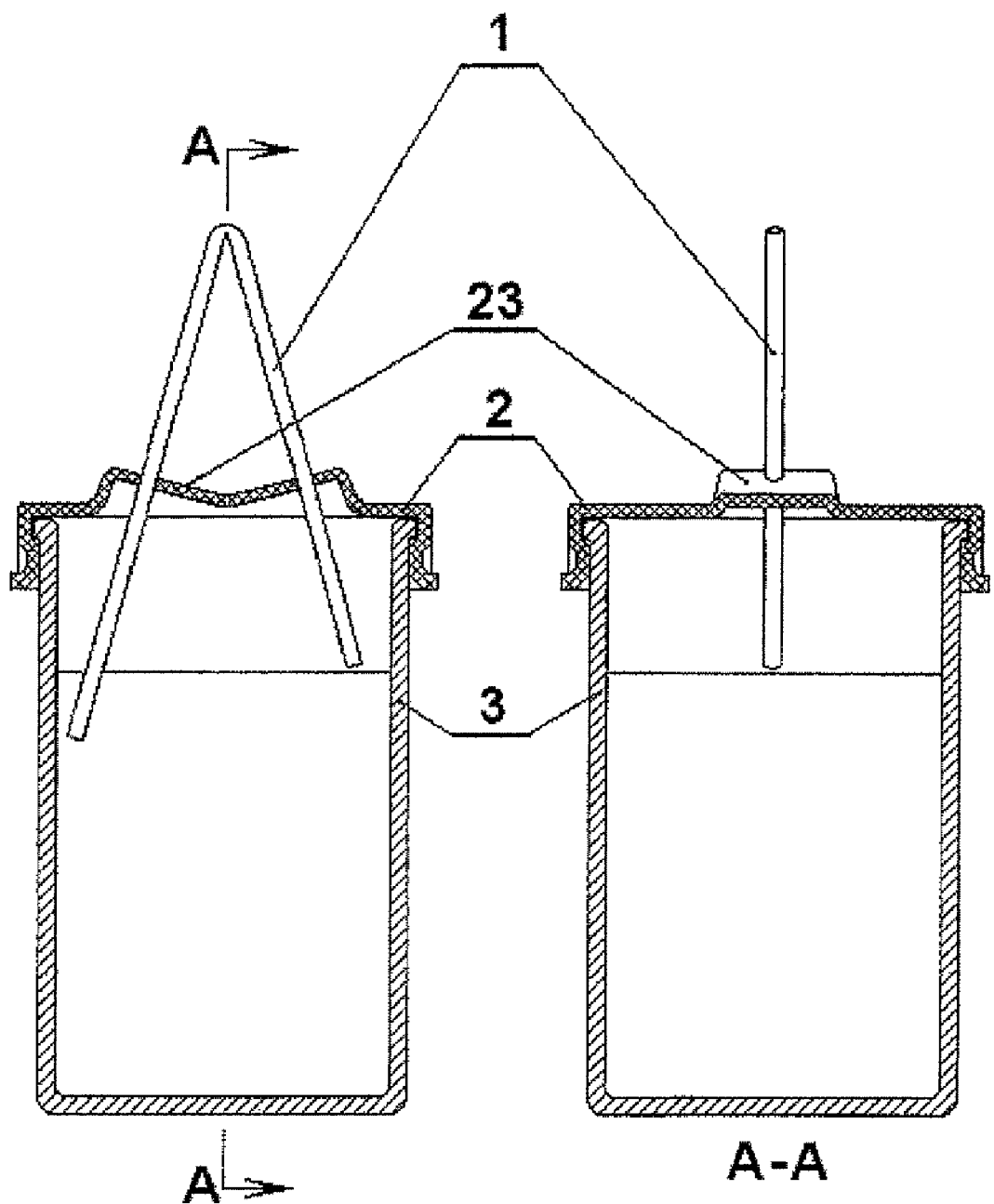
FIG. 7 illustrates a container of liquid food products or a cap thereof, wherein a drinking tube bent to the V shape by consumer is inserted.
Figure 8A:
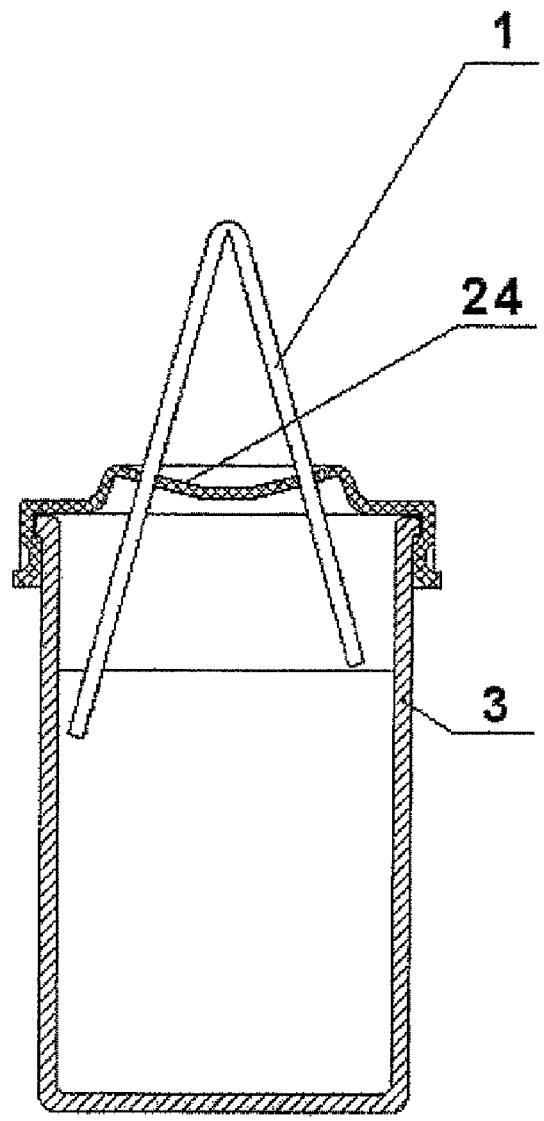
FIG. 8A and 8B illustrate another container of liquid food products or a cap thereof, wherein a drinking tube bent to the V shape by consumer is inserted.

According to the present invention, the drinking tube can be bent to form three sections (U-shape) (as shown in FIGS. 1A to 6B), or two sections (V-shape) by the consumer, and then inserted into the two straw holes. To form a V-shaped drinking tube is easier than to form a U-shaped drinking tube, as far as bending is concerned. However, in order to ensure that the two ends of the V-shaped drinking tube are perpendicularly inserted into respective straw holes, the flat surface where the two straw holes are positioned should be different, rather than on the same flat surface. For example, the two straw holes can be on two tilted flat surfaces (23) as shown in FIG. 7, or on a curved surface (24 or 25), as shown in FIGS. 8A and 813. However, the V-shaped drinking tube cannot be inserted into the straw holes on the container as deep as the U-shaped drinking tube where its two ends are parallel. Furthermore, the shape of a container of liquid food products or a cap thereof for inserting V-shaped drinking tube is slightly complex than that for inserting U-shaped drinking tube.

FIG. 7 is cross-section view showing a container of liquid food products or a cap thereof for inserting V-shaped drinking tube. The two straw holes according to the present invention for inserting the drinking tube (1) are on two flat surfaces (23) that are jointed to each other.

Figure 8B:
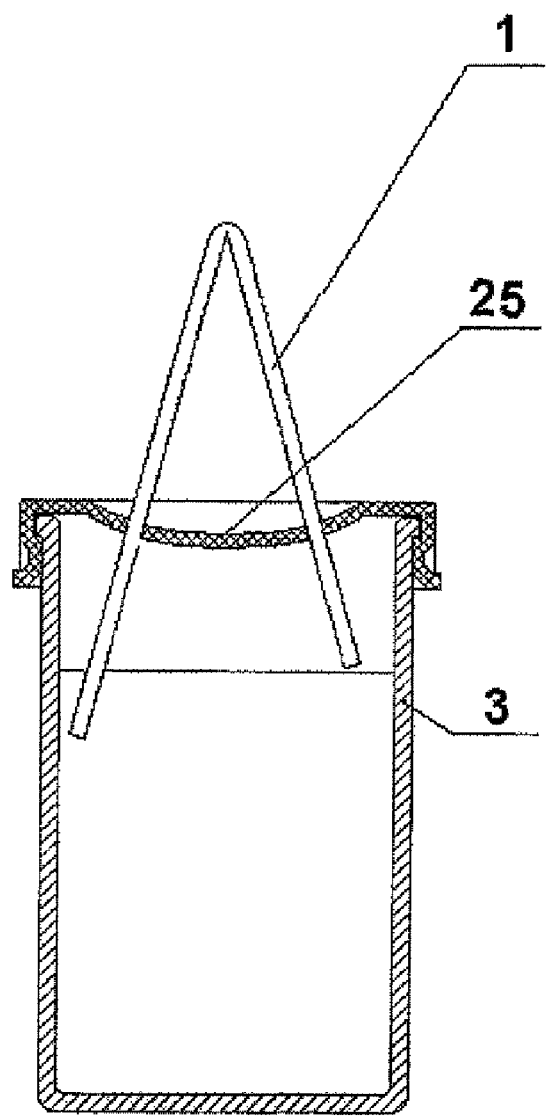

FIGS. 8A and 8B show another container of liquid food products or a cap thereof for inserting V-shaped drinking tube. The two straw holes according to the present invention for inserting the drinking tube (1) are on a cone-shaped surface (24) as shown in FIG. 8A, or on a spherical surface (25), as shown in FIG. 8B. In fact most cylindrical aluminum cans containing pressurized liquid (beer or other drink with pressured gas) have spherical surface at their two ends for withstanding pressures, with one end raised and another plunged.

In order to ensure good isolation while maintain the capability of inserting and pulling the drinking tube repeatedly, the two ends of the U-shaped drinking tube, when inserted into the two straw holes, should remain parallel to each other, and perpendicular to the flat surfaces where the two straw holes are situated. Therefore the section at the bottom of the U-shape must have the size as same as the distance between the two straw holes, while the lengths of the sections at the two ends can be different. This is referred to as "U-shape with proper size".

In order to assist consumers to bend the drinking tube to the "U-shape with proper size", and to allow consumers using the present invention more easily, two kinds of bending devices can be provided on a container of liquid food products or a cap thereof both of them are of the "raised block" type.

Figure 9:
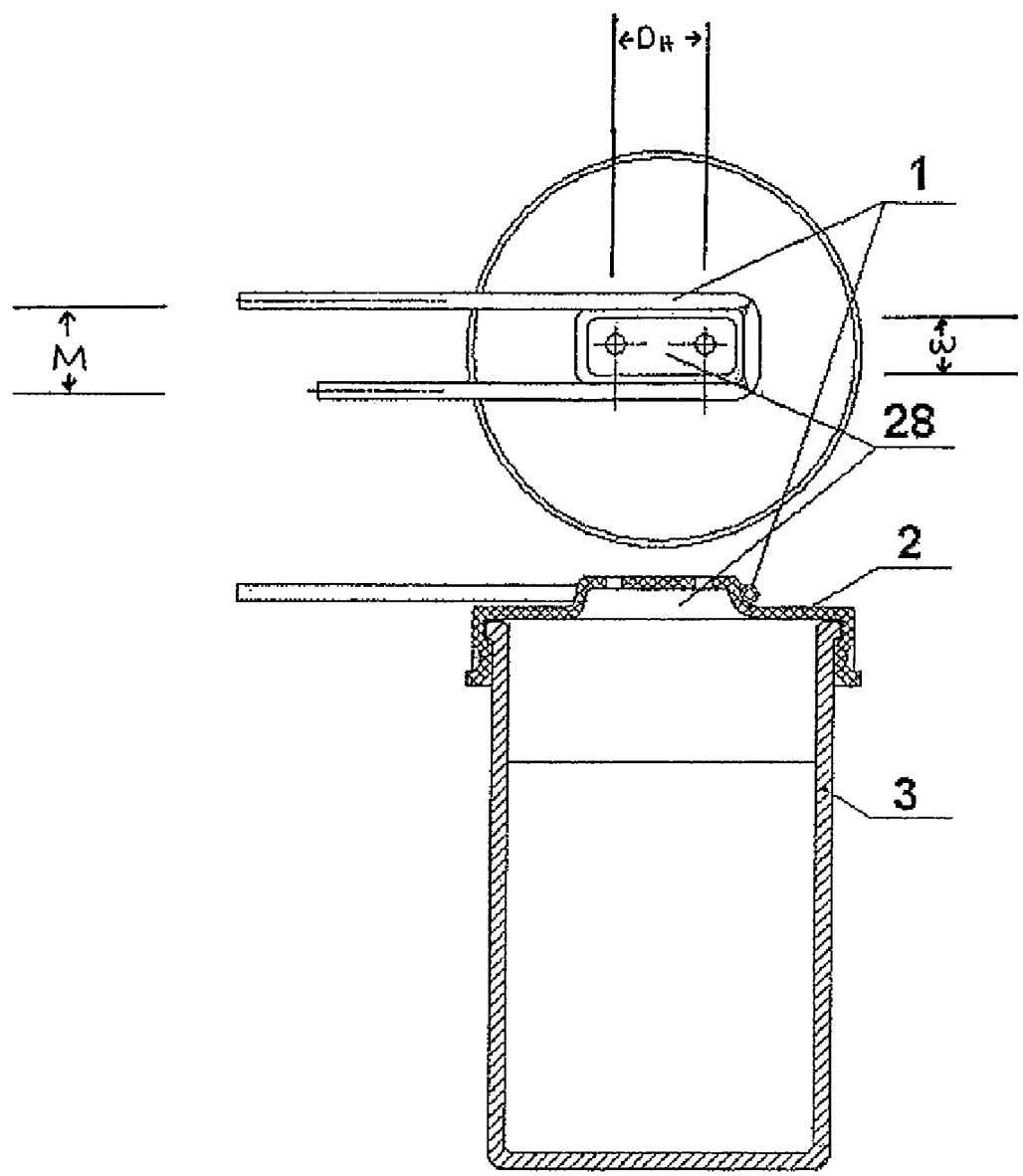
FIG. 9 illustrates a container of liquid food products or a cap thereof where a raised block is punched thereon, forming a device for bending the drinking tube

FIG. 9 shows a container of liquid food products or a cap thereof having a single raised block as the bending device. As shown in FIG. 9, a bending device is provided on the cap of a container of liquid food products or the container, by punching out a raised block (28) that can be rectangular, with circular corner or other shapes. The consumer can bend the drinking tube (1) to the "U-shape with proper size" by using said single raised block bending device.

Figure 10:
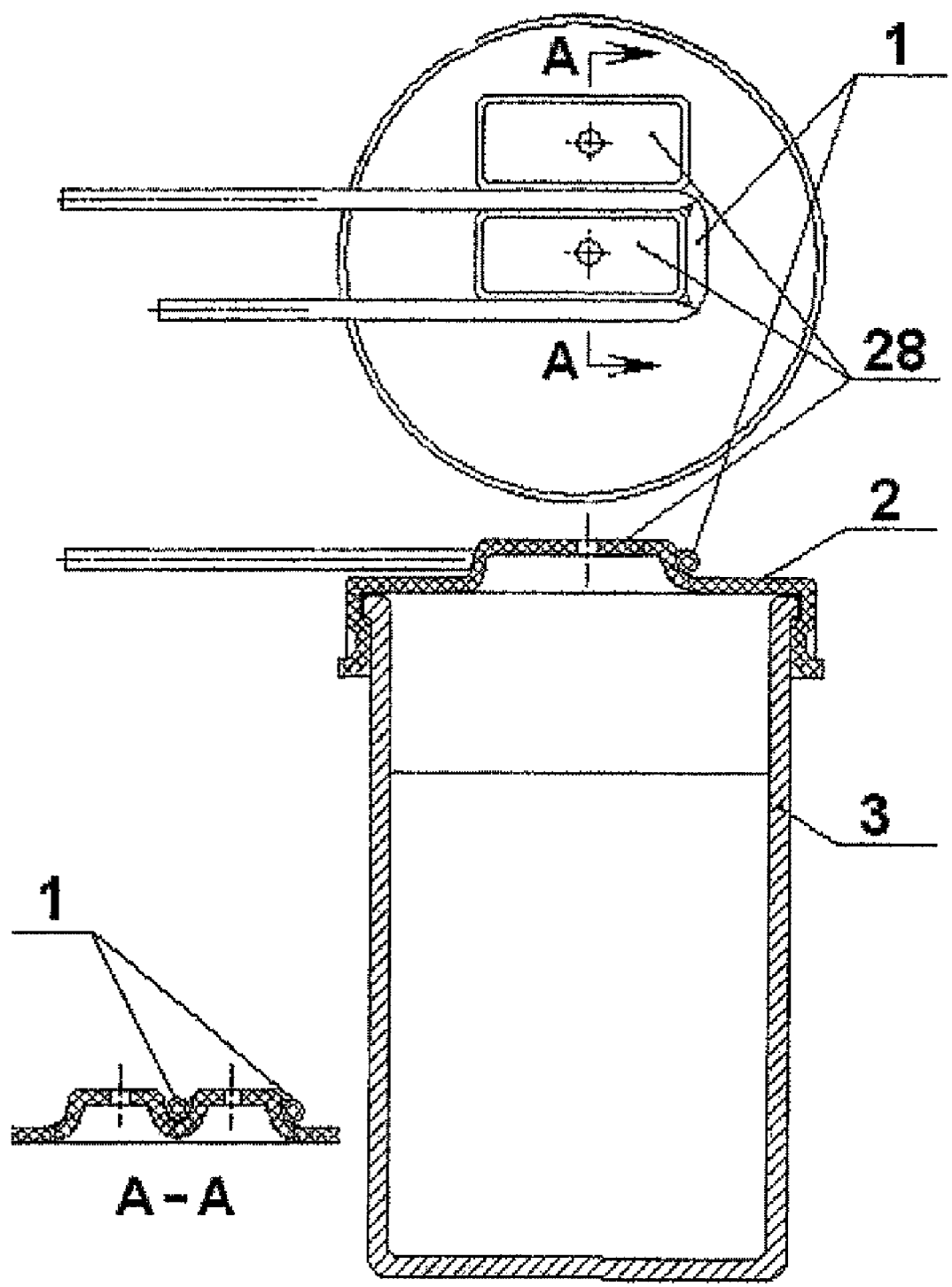
FIG. 10 illustrates a container of liquid food products or a cap thereof where two raised blocks are punched thereon, forming a device for bending the drinking tube.

FIG. 10 shows a container of liquid food products or a cap thereof having two raised blocks as the bending device. As shown in FIG. 10, the bending device is formed by punching out two raised blocks (28). When using the bending device, the consumer puts the drinking tube (1) to the groove between the two blocks (28), presses the drinking tube with a finger to keep it in the position parallel to the surface of the container cap, then bend the drinking tube around one raised block to form the "U-shape with proper size". The raised blocks (28) can be formed to rectangular, with circular corner or other shapes.

Designing the sealed container of liquid food products having two round straw holes may encounter problems that do not exist when designing container cap of liquid food products, namely:

(1) The two straw holes on the container cap are opened, but the two straw holes on the packaged container of liquid food products must be sealed after being manufactured to keep the liquid pressure or keep the original characteristics of the liquid food. Therefore, considerations must be given to how the two straw holes are sealed and how they should be opened by consumers.

(2) With the container of liquid food products, the consumer could choose pouring the liquid into a cup or drinking directly without a drinking tube. This could be realized by simply removing the sealed straw hole on the container. However, with sealed packaged container of liquid food products, it seems that it would be a little difficult to pour the liquid to a cup or to drink directly if only two straw holes are provided.

Solutions are provided in the following paragraphs for sealing and opening the straw holes, and for dealing with the problems of pouring the liquid into a cup, for both aluminum can and carton based packages of liquid food products.

The traditional way to open the canned drink is to pull out the pre-defined opening area formed by a groove. The method provided by the present invention is to open two round straw holes that have the same diameters as the drinking tube. By using the metal ring (211) as shown in FIG. 11A, two round straw holes (214) can be formed by a single operation.

Figures 11A, 11B:
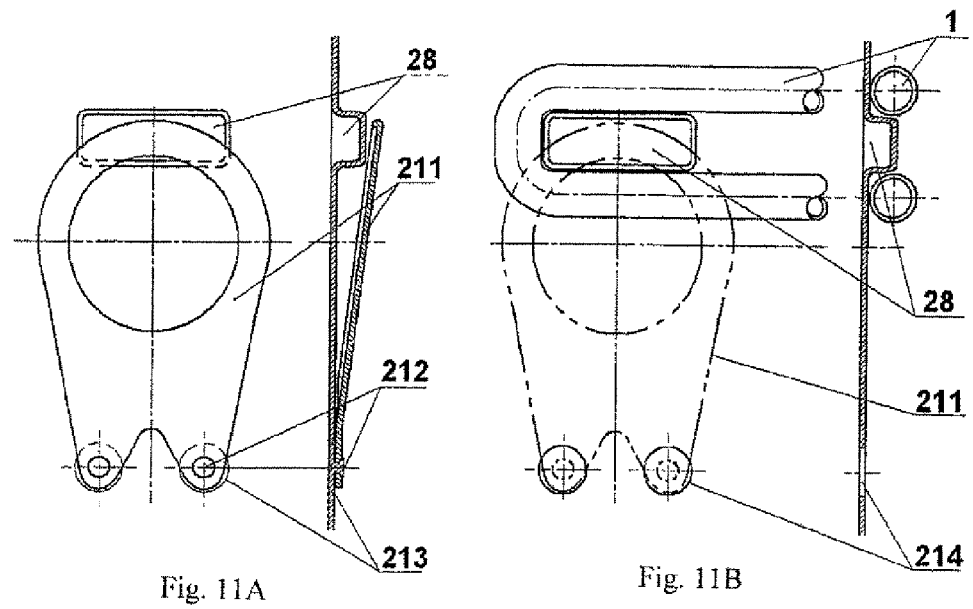
FIGS. 11A and 11B illustrate an embodiment where two straw holes are provided on the aluminum can of liquid food products.

The process of producing two round straw holes is described as following, with reference to the FIG. 11A: when the metal ring (211) is pulled upwards from the raised block (28), the other ends of the ring element (211) will press and tear the two circular grooves (213) under the fixation points of said ring. Then the ring (211) will completely pull the torn circular parts out to form two straw holes (214).

The raised block (28) can be used to bend the drinking tube into U-shape, as shown in FIG. 11B, wherein the distance between the two straw holes is the same as the distance of the U-shaped drinking tube at its two parallel ends. In this case the two ends of the U-shaped drinking tube can be inserted into the opened straw holes, so that the two opened straw holes are closed by the drinking tube.

The raised block serves two purposes: to bend the drinking tube and to raise the metal ring to form a gap between the ring and the surface of the container, facilitating easy pulling by finger.

Figures 12A, 12B:
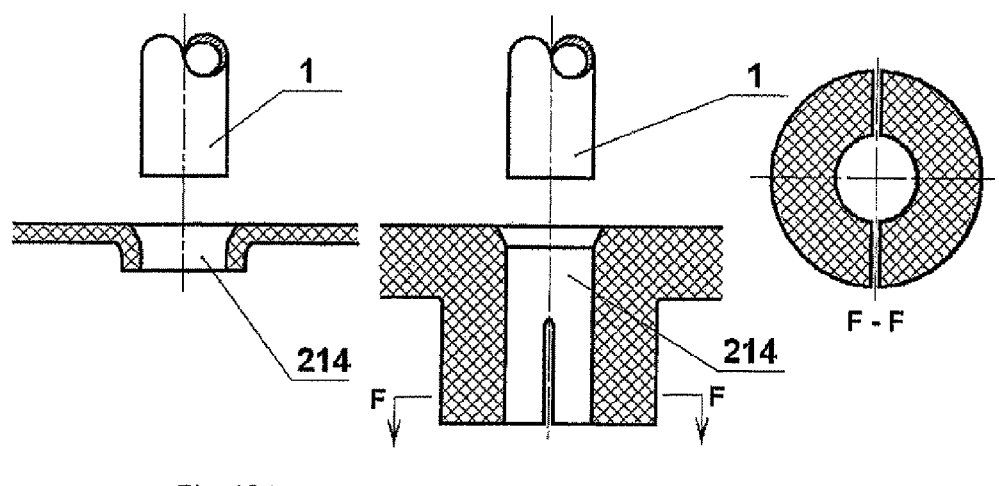
FIGS. 12A and 12B illustrate one embodiment of the straw holes on a cap of container of liquid food products according to the present invention.

FIGS. 12A and 12B are cross-section views showing an embodiment of the straw holes according to the present invention. The two straw holes (214) can be cone-shaped, with their inner diameters of the top end of the straw holes slightly bigger than the outer diameter of the drinking tube (1), and their inner diameters of the bottom of the straw holes slightly smaller than that of the drinking tube (1), as shown in FIG. 12A. Alternatively, The two straw holes (214) can be cone-shaped, with their diameters at the outside surface of the container slightly bigger than the diameter of the drinking tube (1), and their diameters at the inner surface of the container the same as that of the drinking tube (1), and with a flexible opening at the inner end for holding the drinking tube, as shown in FIG. 12B.

Compared with the current single-hole aluminum can that can tear out a big opening, the aluminum container of liquid food products according to the present invention only provides two small round straw holes that match the diameters of the drinking tube. Therefore it does not seem to serve the purpose of direct drinking or pouring the liquid into a cup with these two small straw holes. However, attaching a bendable drinking tube with one section extendable, the diameter of which matches the opening straw holes, to the aluminum container can bring about advantages so that direct drinking is no longer necessary. For pressurized liquid food product, the two ends of the bendable drinking tube have cone-shaped joints. The inner extendable section is inserted into the straw hole reaching the bottom of the container, then the cone-shaped joints are tightly engaged with the two straw holes on the aluminum container. When pouring the liquid into a cup, the attached drinking tube is inserted into one straw hole, and the liquid is flowing out through another straw hole. The ends of the inserted drinking tube that remains both outside and inside of the container should be higher than the liquid level in the container.

Carton based packages of liquid food products is another commonly used sealed container, which is often in the form of a box made of multi-layer carbon based materials. The round straw hole on the box can be opened by inserting the drinking tube through it and then into the liquid inside. Direct drinking is not necessary since every package is attached with a drinking tube, and it's also the case for the present invention where two straw holes are provided. Two types of drinking tubes are normally attached: two-section extendable drinking tube as shown in FIG. 3A, or U-shaped drinking tube as shown in 4A. Both types of drinking tubes are attached along the diagonal direction of the box of liquid food products, and extended or bent before being inserted into the box. For U-shaped drinking tubes, no bending device needs to be provided. However, a bending mechanism is needed for the two-section extendable drinking tube. The most simple way is to use the shortest side (length W) of the box for bending the drinking tube to form a U-shaped drinking tube comprising two elongated sections and a middle section, where the middle section (M) has the length of W+D (diameter of the drinking tube), and where (D) also equals ½ of the diameter of one of the two elongated sections plus ½ of the diameter of the other of the two elongated sections. The distance between the center points of the two straw holes provided on the box should therefore be W+D in order to receive the two ends of the bent drinking tube smoothly.

In order to pour the drinking liquid to a cup, in stead of cutting the corner of the box with scissors, the box should be held in the way that one straw hole is on top and another straw hole is at bottom, so liquid is flowing out through the bottom straw hole. Of course, the drinking liquid can flow out through one straw hole with another straw hole being inserted with the drinking tube, the end of the inserted drinking tube that remain outside of the box should be higher than the liquid level.

It is to be understood that the above-referenced embodiments are only illustrative and should not be treated as restrictive to the scope of the present invention. Other modifications and alternative embodiments can be devised without departing from the spirit and scope of the present invention while the present invention has been shown in details only as preferred embodiments of the invention, and it is intended that all such modifications and alternative embodiments be covered by the claims appended hereto.

The invention claimed is:

1. A cap for a container of a liquid food product, said cap comprising:
    an upper surface having a first hole having a center point therein;
    at least one raised block having a second hole having a center point therein; said at least one raised block comprising four side walls; at least one of said four side walls having a length (W); each of said first hole and said second hole providing access to an interior portion of the container; and
    a drinking tube having a diameter (D);
    wherein said at least one raised block is used to bend said drinking tube around three of said four side walls, such that said drinking tube has two substantially parallel, elongated sections and a middle section (M) having a length of (W+D), where (D) also equals ½ of the diameter of one of said two elongated sections of said drinking tube plus ½ of the diameter of another of said two elongated sections of the drinking tube; and
    wherein a distance ($D_H$) between said center point of said first hole and said center point of said second hole is substantially the same as said length of said middle section (M) of said drinking tube; and
    wherein, when said drinking tube is in a stored position, both a first end and a second end of said drinking tube extend into the interior portion of the container.

2. The cap according to claim 1, wherein said first hole and said second hole are cone-shaped, an inner diameter of a top end of said first hole and an inner diameter of a top end of said second hole being larger than an outer dimension of said drinking tube, and an inner diameter of a bottom end of said first hole and an inner diameter of a bottom end of said second hole tightly matching with said outer dimension of said drinking tube such that said drinking tube can be inserted into or pulled out from each of said first hole and said second hole repeatedly.

3. A container, said container comprising:
    a body; and
    a top, said top fitted to said body and being hermetically sealed to preserve original characteristics of a liquid food product contained therein, said top comprising:
        an upper surface having a first hole having a center point therein;
        at least one raised block having a second hole having a center point therein; said at least one raised block comprising four side walls; at least one of said four side walls having a length (W); each of said first hole and said second hole providing access to an interior portion of the container; and
        a drinking tube having a diameter (D);
        wherein said at least one raised block is used to bend said drinking tube around three of said four side walls, such that said drinking tube has two substantially parallel, elongated sections and a middle section (M) having a length of (W+D), where (D) also equals ½ of the diameter of one of said two elongated sections of said drinking tube plus ½ of the diameter of another of said two elongated sections of the drinking tube; and
        wherein a distance ($D_H$) between said center point of said first hole and said center point of said second hole is substantially the same as said length of said middle section (M) of said drinking tube; and
        wherein, when said drinking tube is in a stored position, both a first end and a second end of said drinking tube extend into the interior portion of said container.

4. The cap according to claim 3, wherein said first hole and said second hole are cone-shaped, an inner diameter of a top end of said first hole and an inner diameter of a top end of said second hole being larger than an outer dimension of said drinking tube, and an inner diameter of a bottom end of said first hole and an inner diameter of a bottom end of said second hole tightly matching with said outer dimension of said drinking tube such that said drinking tube can be inserted into or pulled out from each of said first hole and said second hole repeatedly.

* * * * *